(12) United States Patent
Huang

(10) Patent No.: US 9,778,577 B2
(45) Date of Patent: Oct. 3, 2017

(54) STRUCTURE AND METHOD FOR TESTING STRIP WIDTH OF SCRIBING SLOT

(71) Applicant: CSMC TECHNOLOGIES FAB2 CO., LTD., Jiangsu (CN)

(72) Inventor: Wei Huang, Jiangsu (CN)

(73) Assignee: CSMC TECHNOLOGIES FAB2 CO., LTD., Jiangsu (CN)

( * ) Notice: Subject to any disclaimer, the term of this patent is extended or adjusted under 35 U.S.C. 154(b) by 13 days.

(21) Appl. No.: 14/762,837

(22) PCT Filed: Dec. 31, 2013

(86) PCT No.: PCT/CN2013/091022
§ 371 (c)(1),
(2) Date: Jul. 23, 2015

(87) PCT Pub. No.: WO2014/108035
PCT Pub. Date: Jul. 17, 2014

(65) Prior Publication Data
US 2015/0354945 A1 Dec. 10, 2015

(30) Foreign Application Priority Data
Jan. 23, 2013 (CN) .......................... 2013 1 0025250

(51) Int. Cl.
*G03F 7/20* (2006.01)
*H01L 23/544* (2006.01)
(Continued)

(52) U.S. Cl.
CPC .......... *G03F 7/70625* (2013.01); *G01B 11/02* (2013.01); *H01L 22/12* (2013.01); *H01L 23/544* (2013.01)

(58) Field of Classification Search
CPC ......... G01B 11/02; G01B 11/14; H01L 22/12; H01L 23/544; G03F 7/70608; G03F 7/70616; G03F 7/70625
See application file for complete search history.

(56) References Cited

U.S. PATENT DOCUMENTS 5,242,770 A * 9/1993 Chen .......................... G03F 1/36
378/35
6,063,531 A * 5/2000 Singh .................. G03F 7/70641
356/401
(Continued)

FOREIGN PATENT DOCUMENTS

CN 101192594 A 6/2008

OTHER PUBLICATIONS

International Search Report PCT/CN2013/091022 mailed on Mar. 20, 2014.

*Primary Examiner* — Gordon J Stock, Jr.
(74) *Attorney, Agent, or Firm* — Polsinelli PC

(57) ABSTRACT

A testing structure of a strip width of a scribing slot is provided, the structure includes a first isolated line (232) and a second isolated line (234) which are perpendicular to each other, the testing structure further includes a first field region pattern (220), the first field region pattern (220) includes two graphics, the two graphics are each located on one side of the first isolated line (232) and opposite to each other. A testing method of a strip width of a scribing slot is also disclosed. Graphics of the field oxide region simulating the LOCOS structure are provided on two sides of the isolated line, the step is artificially generated, a polysilicon gate graphic on a small size source region formed by photolithography can be displayed through online testing of the strip width or online displaying and checking of the strip width, thus a practical situation of the die can be known, an abnormity of the strip (Continued)

width and morphology of the polysilicon gate caused by a reflection of a substrate can be found instantly.

10 Claims, 9 Drawing Sheets

(51) Int. Cl.
*G01B 11/02* (2006.01)
*H01L 21/66* (2006.01)

(56) References Cited

U.S. PATENT DOCUMENTS

| | | | |
|---|---|---|---|
| 6,388,290 B1* | 5/2002 | Celler | H01L 21/2007 257/350 |
| 2005/0227171 A1 | 10/2005 | Kawana | |
| 2010/0231878 A1* | 9/2010 | Shin | G03B 27/54 355/67 |
| 2013/0120739 A1* | 5/2013 | Dai | G03F 7/70633 356/72 |

\* cited by examiner

STRUCTURE AND METHOD FOR TESTING STRIP WIDTH OF SCRIBING SLOT

CROSS REFERENCE TO RELATED APPLICATIONS

This application is a national stage application (under 35 U.S.C. §371) of PCT/CN2013/091022 filed Dec. 31, 2013, which claims priority to Chinese Application No. 201310025250.6, filed Jan. 23, 2013, the contents of which are incorporated herein by reference in its entirety.

FIELD OF THE INVENTION

The present invention relates to photolithography processes, and more particularly relates to a structure for testing a strip width of a scribing slot and a method for testing the strip width of the scribing slot.

BACKGROUND OF THE INVENTION

Photolithography process is a key step of modern semiconductor fabrication, a strip width is a key parameter which characterizes the photolithography process, a real-time monitoring is needed when performing the photolithography process. One monitoring method is to form a unified testing graphic in a scribing slot by performing the photolithography process, and test the strip widths of these testing graphics. FIG. 1 is a schematic view showing a die 11 and a scribing slot 12 on a wafer, the scribing slot 12 is a white structure separating dies 11 in FIG. 1. Actually, the scribing slot 12 is not as wide as that shown in FIG. 1.

A unified testing graphic rule is provided in the scribing slot, special marks of several levels are provided, and they are easy to be recognized, automatic testing programs are developed for the testing. FIG. 2 shows two photolithography level monitoring graphics of the strip width of the scribing slot, English characters in the lower right corner are photolithography level marks, a strip-like structure is a testing graphic of the strip width. Generally, a single isolated line is tested, or one of dense strip-like structures is tested. The testing graphic of the strip width of the scribing slot can be applied to different products, which brings great conveniences for the real-time monitoring.

However, testing using a testing graphic of the scribing slot is deficient for some process in some level. For example, the product using a technology of local oxidation of silicon (LOCOS) has a great step in the die. For the polysilicon gate level in the LOCOS process, the testing graphic of the strip width of the scribing slot is generally formed on a silicon substrate by photolithography, the silicon substrate is flat. But the step would affect the polysilicon gate level on the die.

FIG. 3 is a top view of a typical device having a LOCOS structure, the device includes a source region 110, a field oxide region 120 and a polysilicon gate 130. FIG. 4 is a cross-sectional view of the device, FIG. 5 is a schematic view of the device when performing the photolithography process. According to FIG. 5, because of the step, vertical incident light will reflect on the other direction, it would lead to an exposure of a part of a photoresist 140 which should be blocked by a mask 20.

FIG. 6 is a photo of the product when performing a photolithography process, as we can see from the photo, because of the light reflected at the step, a local area of a photoresist graphic would become thin and slim. Under the extreme condition, a photoresist strip will break, which will affect a morphology and a strip width of an etched polysilicon gate. Such affection will be enlarged when a focal length of a photolithography machine is shifted.

As mentioned above, the testing graphic of the strip width of the scribing slot is a flat source region having a large area, which cannot reflect a situation of an actual strip width of a step structure in the die and will lead to that the die having an abnormal polysilicon gate will enter into a next process, a yield of the product will be affected.

SUMMARY OF THE INVENTION

Accordingly, it is necessary to provide a testing structure for a strip width of a scribing slot which can reveal an actual situation of a strip width of a step structure in the die.

A testing structure for a strip width of a scribing slot includes a first isolated line and a second isolated line which are perpendicular to each other, the testing structure further includes a first field region pattern, the first field region pattern includes two graphics, the two graphics are each located on one side of the first isolated line and opposite to each other.

According to one embodiment, distances from the two graphics to the first isolated line are the same.

According to one embodiment, the number of the first field region pattern is at least two, distances from the graphics in different first field region patterns to the first isolated line are not equal.

According to one embodiment, the graphic is a rectangle, a pair of opposite sides of the rectangle are parallel with the first isolated line.

According to one embodiment, a distance from one side of the pair of opposite sides parallel to the first isolated line and close to the first isolated line to the first isolated line is ranged from 1 μm to 5 μm.

According to one embodiment, the first isolated line and the second isolated line form a right angle fold line, the testing structure for the strip width of the scribing slot further includes a second field region pattern, the second field region pattern is on an inner side of a right angle formed by the first isolated line and the second isolated line, the second field region pattern includes a pair of rectangular graphics parallel to the second isolated line.

According to one embodiment, the second field region pattern further includes a strip-like graphic, the strip-like graphic is parallel with a side of a rectangular graphic of the second field region pattern which is perpendicular to the second isolated line.

According to one embodiment, the number of the second field region pattern is at least two, in each of the second field region patterns, a length of the strip-like graphic is equal to a side of the rectangular graphic, distances of each second field region pattern to the second isolated line are the same.

A testing method for a strip width of a scribing slot includes the following steps:
 providing a mask of the testing structure for the strip width of the scribing slot;
 transferring the testing structure for the strip width of the scribing slot to a scribing slot on a wafer by performing a photolithography process;
 testing a line width of the testing structure for the strip width of the scribing slot on the wafer.

According to one embodiment, the testing structure for the strip width of the scribing slot is transferred to a surface of a monocrystalline silicon source region of a wafer by photolithography.

In the testing structure for the strip width of the scribing slot, graphics of the field oxide region simulating the LOCOS structure are provided on two sides of the isolated line, the step is artificially produced. A polysilicon gate graphic on a small size source region formed by photolithography can be reproduced instantly through online testing of the strip width or online displaying and checking of the strip width, thus a real situation of the die can be known, an abnormity of the strip width and morphology of the polysilicon gate caused by a reflection of a substrate can be found instantly.

DETAILED DESCRIPTION OF THE EMBODIMENTS

The above objects, features and advantages of the present invention will become more apparent by describing in detail embodiments thereof with reference to the accompanying drawings.

Figure 1:
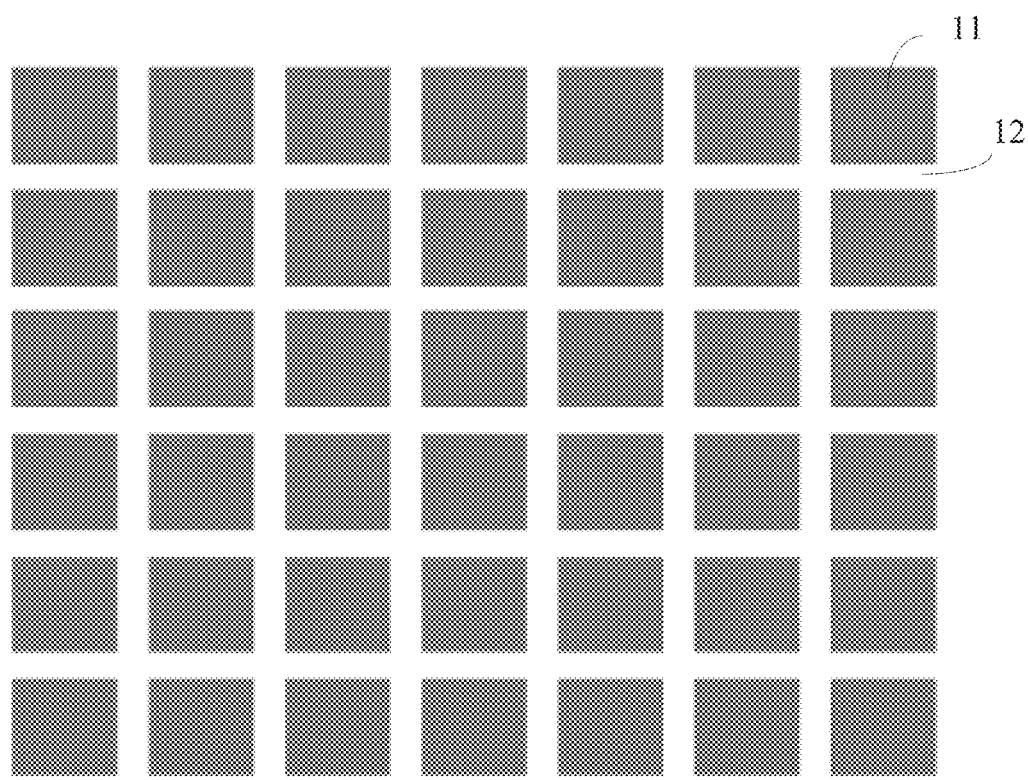
FIG. 1 is a schematic view showing a die and a scribing slot on a wafer.
Figure 2:
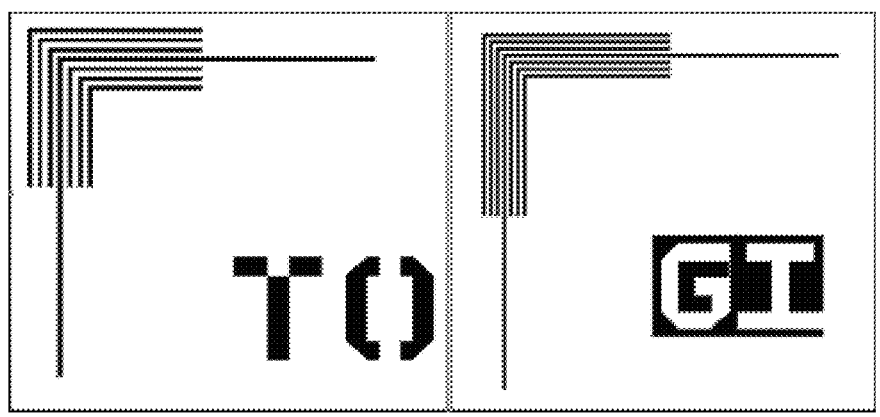
FIG. 2 are monitoring graphics of a strip width of the scribing slot of two common photolithography levels in conventional technology.
Figure 3:
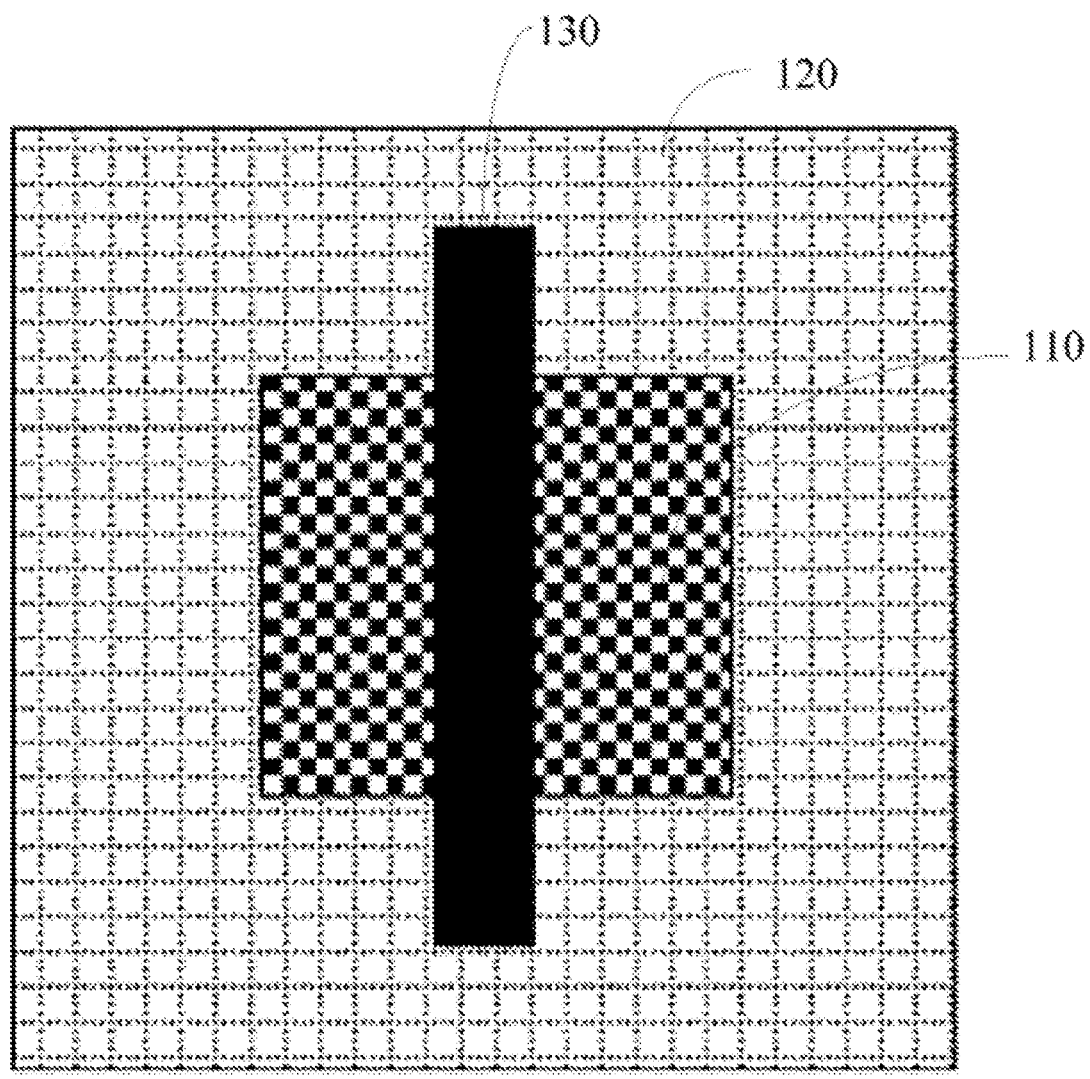
FIG. 3 is a top view of a typical device having a LOCOS structure.
Figure 4:
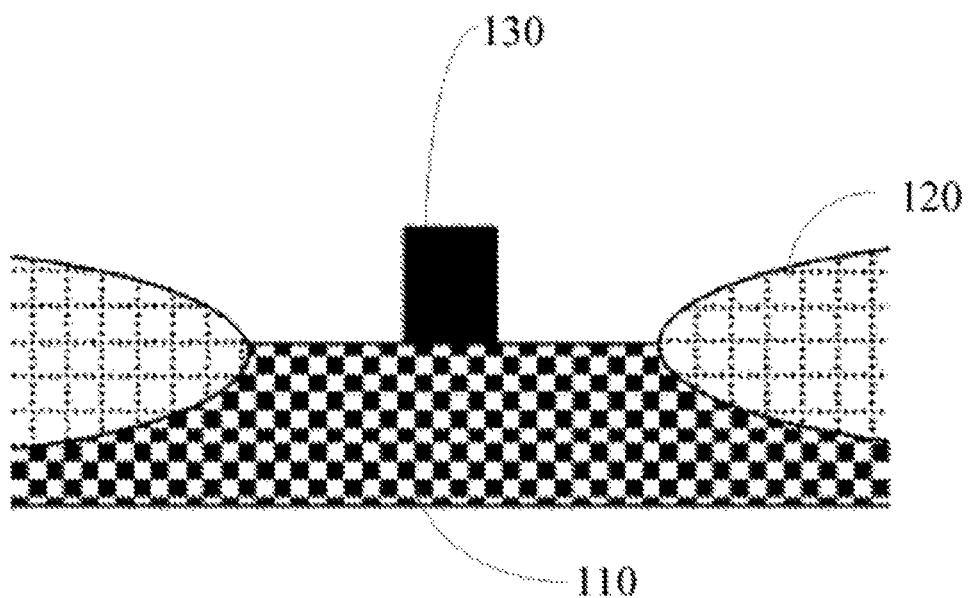
FIG. 4 is a cross-sectional view of the device shown in FIG. 3.
Figure 5:
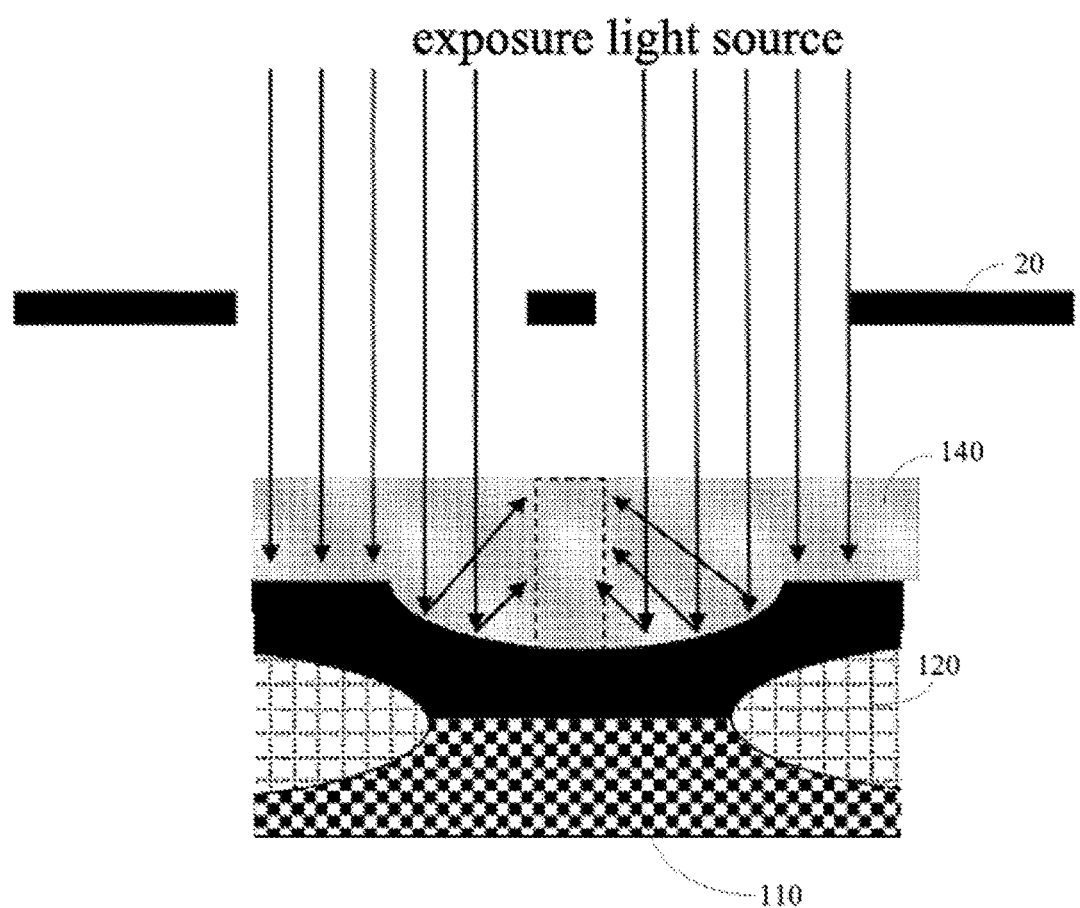
FIG. 5 is a schematic view of the device shown in FIG. 3 when performing a photolithography process.
Figure 6:
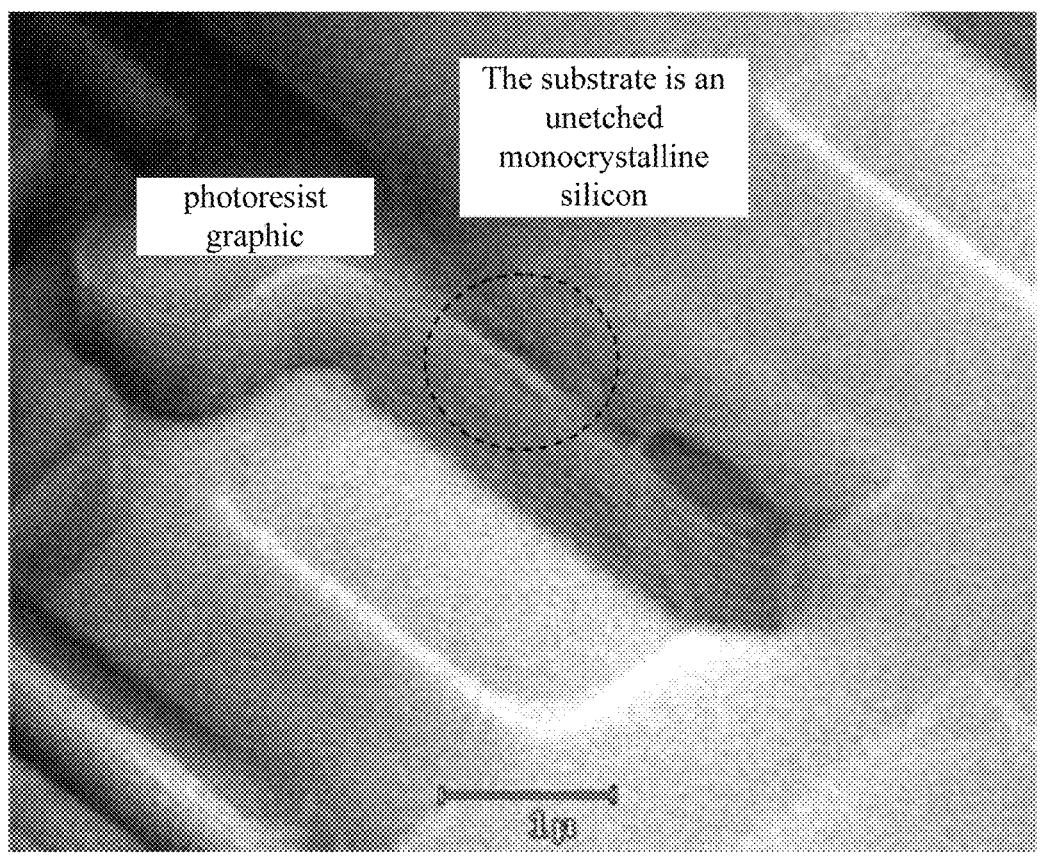
FIG. 6 is a microscope photo of the product when performing a photolithography process.
Figure 7:
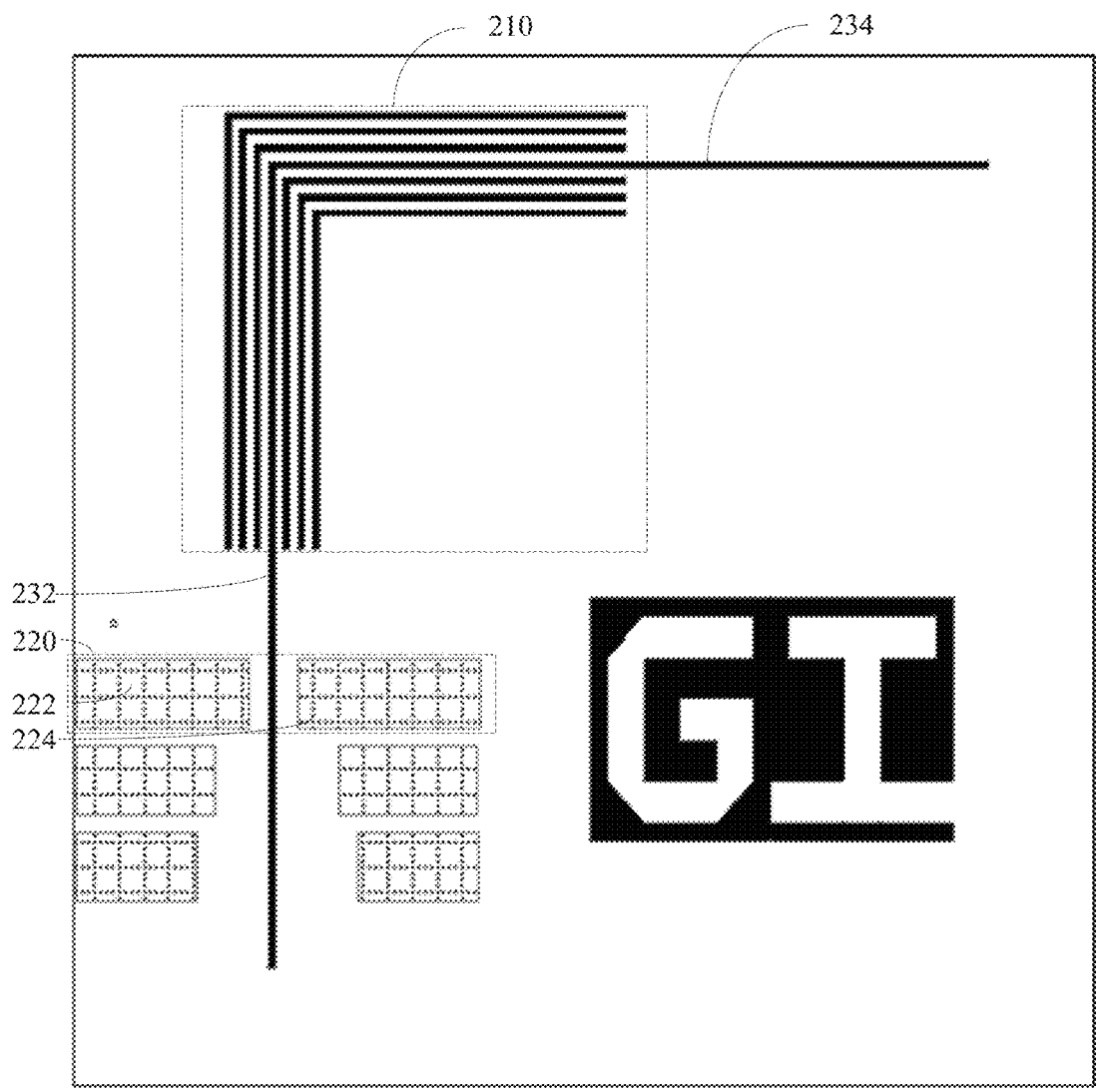
FIG. 7 is a schematic view of a testing structure for the strip width of the scribing slot according to one embodiment.

FIG. 7 is a schematic view of a testing structure for a strip width of a scribing slot according to one embodiment, the testing structure includes a first isolated line 232 and a second isolated line 234 which are perpendicular to each other, the testing structure further includes a first field region pattern 220. The first field region pattern 220 includes a first graphic 222 and a second graphic 224, which are located at two sides of the first isolated line 232 and opposite to each other, i.e. the first graphic 232 and the second graphic 234 are located at a left side and a right side of the first isolated line 232, respectively, as shown in FIG. 7. The field region pattern 220 is a graphic configured to simulate a field oxide region of a LOCOS structure.

In the illustrated embodiment shown in FIG. 7, the first graphic 222 and the second graphic 224 are rectangles, and they have the same distance to the isolated line 232. The first graphic 222 and the second graphic 224 are the same graphic and they have the same shape and the same size. The first graphic 222 and the second graphic 224 can also be different graphics. Referring to FIG. 7, two sides of the rectangle are parallel with the first isolated line 232.

Referring to FIG. 7, in order to simulate the situation of polysilicon gates which have different distances to the field oxide region, a plurality of first field region patterns 220 can be provided, distances from graphics in different first field region patterns 220 to the first isolated line 232 are different.

It has been found out that, the condition resulting in abnormity of the polysilicon gate photoresist graphic is related to a height of the step and a distance from the polysilicon gate to the step. Typically, a height of the step of the LOCOS process is ranged from 0.1 μm to 0.3 μm, a distance from the polysilicon gate to the step is ranged from 1 μm to 5 μm, such abnormity easily occurs when steps locate on two sides of the polysilicon gate. In one embodiment, distances from a plurality of first field region patterns 220 to the first isolated line 232 are ranged from 1 μm to 5 μm.

In the testing structure for the strip width of the scribing slot, graphics of the field oxide region simulating the LOCOS structure are provided on two sides of the isolated line, the step is produced, a polysilicon gate graphic on a small size source region formed by photolithography can be displayed through online testing of the strip width or online displaying and checking of the strip width, thus a practical situation of the die can be known, an abnormity of the strip width and morphology of the polysilicon gate caused by a reflection of a substrate can be found instantly.

In one embodiment, referring to FIG. 7, the first isolated line 232 and the second isolated line 234 form a right angle fold line, the testing structure of the scribing slot further includes a dense strip structure 210. The dense strip structure 210 includes a plurality of right angle fold lines, two sides of each right angle fold line are parallel with one isolated line, vertices of each right angle fold line are joined to form a line segment, an intersection point of the first isolated line 232 and the second isolated line 234 is located on the line segment.

Figure 8:
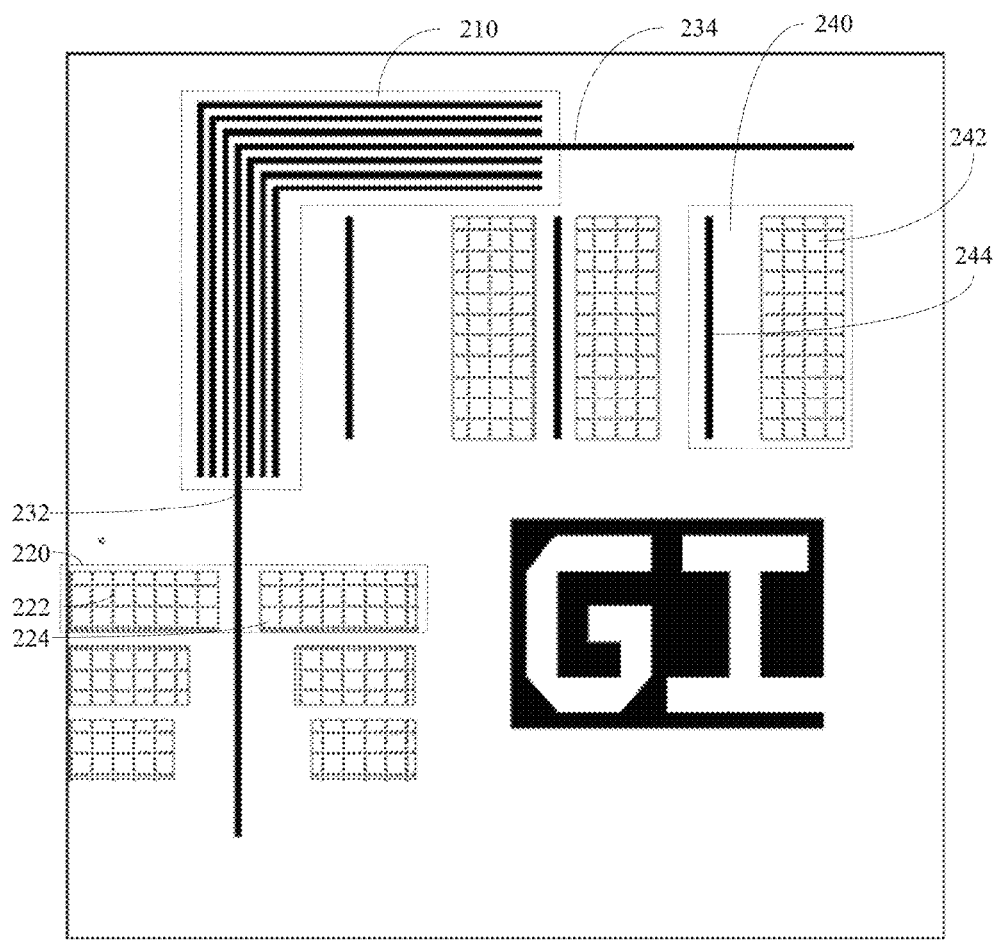
FIG. 8 is a schematic view of a testing structure for the strip width of the scribing slot according to another embodiment.

In another embodiment, referring to FIG. 8, a second field region pattern 240 is added. The second field region pattern 240 is on the inner side of a right angle formed by the first isolated line 232 and the second isolated line 234. The second field region pattern 240 includes a rectangular graphic 242, a pair of opposite sides of the rectangular graphic 242 are parallel with the second isolated line 234.

In one embodiment, referring to FIG. 8, the second field region pattern 240 further includes a strip-like graphic 244. The strip-like graphic 244 is parallel to a side of the rectangular graphic 242 which is perpendicular to the second isolated line 234, and they have the same length. In the illustrated embodiment, a perpendicular bisector of the strip-like graphic 244 is coincident with a perpendicular bisector of the side (of the rectangular graphic 242) parallel to the strip-like graphic 244.

There are a plurality of second field region patterns 240, distances from each second field region pattern 240 to the second isolated line are identical. In a different second field region pattern 240, distances from the strip-like graphic 244 to corresponding rectangular graphic 242 are different from each other.

As the testing structure for the strip width of the scribing slot is to be transferred to the scribing slot, a size of the testing structure for the scribing slot is smaller than that of the scribing slot. For example, for a scribing slot with a size of from 40 μm to 100 μm, a size of a corresponding testing structure of the scribing slot is limited to 30 μm to 90 μm.

The testing structure of the scribing slot shown in FIG. 8 is not only applicable to the die in which the polysilicon gate is affected by the step, thus inducing a substrate reflection (in this situation, the strip width of the second isolated line 232 is tested), and it is also applicable to the die which is not affected by the step (in this situation, the strip width of second isolated line 234 is tested), the test is selected according to the actual structure of the die. A microscope is used to test the first isolated line 232, and a scanning electron microscope is used to test the second isolated line 234.

Referring to FIG. 7 and FIG. 8, the testing structure for the strip width of the scribing slot further includes English characters located on the lower right corner thereof used to mark a photolithography level code. The testing structure for the strip width of the scribing slot is mainly applicable to the polysilicon gate photolithography level of a LOCOS process, generally, an anti-reflective graphic is not provided in this photolithography process.

Figure 9:
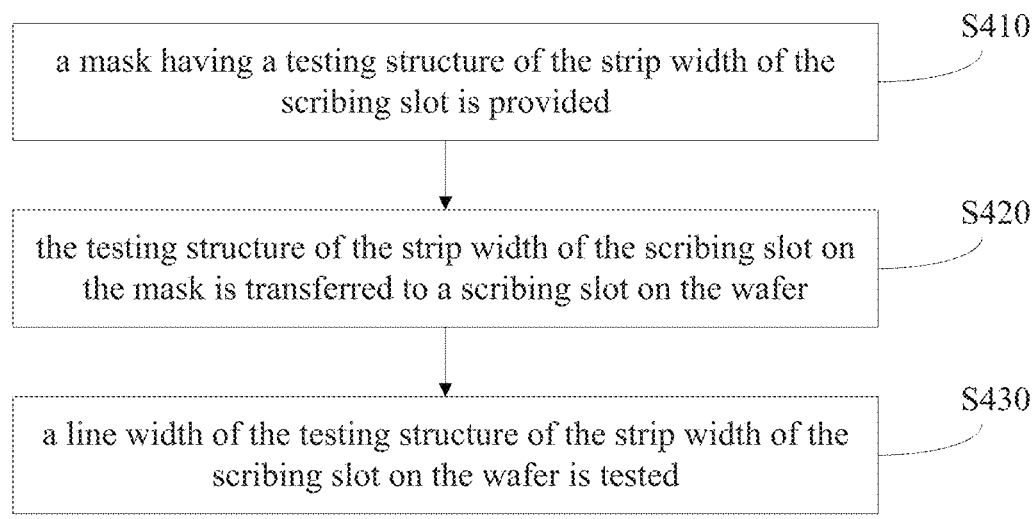
FIG. 9 is a flow chart of a testing method for the strip width of the scribing slot according to one embodiment.

Referring to FIG. 9, a testing method for a strip width of a scribing slot is also provided in the present invention, which includes the following steps:

S410, a mask having the testing structure for the strip width of the scribing slot is provided.

S420, the testing structure for the strip width of the scribing slot on the mask is transferred to a scribing slot on the wafer through photolithography.

In one embodiment, the testing structure for the strip width of the scribing slot is formed on a surface of a monocrystalline silicon source region on a wafer by performing a photolithography process.

S430, a line width of the testing structure for the strip width of the scribing slot on the wafer is tested.

Although the present invention has been described with reference to the embodiments thereof and the best modes for carrying out the present invention, it is apparent to those skilled in the art that a variety of modifications and changes may be made without departing from the scope of the present invention, which is intended to be defined by the appended claims.

What is claimed is:

1. A mask of a testing structure for a strip width of a scribing slot, comprising a first isolated line and a second isolated line which are perpendicular to each other, wherein the testing structure further comprises a first field region pattern, the first field region pattern comprises two graphics, the two graphics are each located on one side of the first isolated line and opposite to each other, wherein the first field region pattern is graphic configured to simulate a field oxide region of a local oxidation of silicon (LOCOS) structure, and wherein in response to a photolithography process being applied to the mask the testing structure is transferred to a scribing slot on a wafer.

2. The mask of the testing structure for the strip width of the scribing slot according to claim 1, wherein distances from the two graphics to the first isolated line are the same.

3. The mask of the testing structure for the strip width of the scribing slot according to claim 2, wherein the number of the first field region pattern is at least two, distances from the graphics in different first field region patterns to the first isolated line are not equal.

4. The mask of the testing structure for the strip width of the scribing slot according to claim 3, wherein each graphic is a rectangle, a pair of opposite sides of the rectangle are parallel with the first isolated line.

5. The mask of the testing structure for the strip width of the scribing slot according to claim 4, wherein a distance from one side of the pair of opposite sides parallel to the first isolated line and closer to the first isolated line to the first isolated line is ranged from 1 µm to 5 µm.

6. A testing method for a strip width of a scribing slot, comprising the following steps:
providing a mask of the testing structure for the strip width of the scribing slot according to claim 1;
transferring the testing structure for the strip width of the scribing slot to a scribing slot on a wafer by performing a photolithography process;
testing a line width of the testing structure for the strip width of the scribing slot on the wafer.

7. The testing method for the strip width of the scribing slot according to claim 6, wherein the testing structure for the strip width of the scribing slot is transferred to a surface of a monocrystalline silicon source region of a wafer by photolithography.

8. A mask of a testing structure for a strip width of a scribing slot, comprising a first isolated line and a second isolated line which are perpendicular to each other, wherein the testing structure further comprises a first field region pattern, the first field region pattern comprises two graphics, the two graphics are each located on one side of the first isolated line and opposite to each other, wherein in response to a photolithography process being applied to the mask the testing structure is transferred to a scribing slot on a wafer, and wherein the first isolated line and the second isolated line form a right angle fold line, the testing structure for the strip width of the scribing slot further comprises a second field region pattern, the second field region pattern is on an inner side of a right angle formed by the first isolated line and the second isolated line, the second field region pattern comprises a pair of rectangular graphics parallel to the second isolated line.

9. The mask of the testing structure for the strip width of the scribing slot according to claim 8, wherein the second field region pattern further comprises a strip graphic, the strip graphic is parallel with a side of a rectangular graphic of the second field region pattern which is perpendicular to the second isolated line.

10. The mask of the testing structure for the strip width of the scribing slot according to claim 9, wherein the number of the second field region pattern is at least two, in each of the second field region patterns, a length of the strip graphic is equal to a side of the rectangular graphic, distances of each second field region pattern to the second isolated line are the same.

* * * * *